United States Patent
Freundlich (12) 
(10) Patent No.: US 6,372,980 B1
(45) Date of Patent: *Apr. 16, 2002

(54) MULTI-QUANTUM WELL TANDEM SOLAR CELL

(75) Inventor: Alexandre Freundlich, Houston, TX (US)

(73) Assignee: University of Houston, Houston, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 09/709,930

(22) Filed: Nov. 10, 2000

Related U.S. Application Data (63) Continuation of application No. 09/347,207, filed on Jul. 2, 1999, now Pat. No. 6,147,296, which is a continuation-in-part of application No. 09/105,643, filed on Jun. 26, 1998, now Pat. No. 6,150,604, which is a continuation-in-part of application No. 08/568,129, filed on Dec. 6, 1995, now Pat. No. 5,851,310.

(51) Int. Cl.⁷ .............................................. H01L 31/00
(52) U.S. Cl. ........................ 136/255; 136/262; 257/21; 257/22
(58) Field of Search ................... 136/255, 262; 257/21, 22

(56) References Cited

U.S. PATENT DOCUMENTS

| | | | |
|---|---|---|---|
| 4,234,352 A | 11/1980 | Swanson | |
| 4,278,473 A | 7/1981 | Borden | |
| 4,278,474 A | 7/1981 | Blakeslee | |
| 4,542,256 A | * 9/1985 | Weideman | 136/249 |
| 4,688,068 A | 8/1987 | Chaffin et al. | |
| 4,746,370 A | 5/1988 | Woolf | |
| 4,773,945 A | 9/1988 | Woolf et al. | |
| 5,008,718 A | 4/1991 | Fletcher | |
| 5,009,719 A | 4/1991 | Yoshida | |
| 5,019,177 A | 5/1991 | Wanlass | |
| 5,322,573 A | * 6/1994 | Jain et al. | 136/252 |
| 5,342,451 A | 8/1994 | Virshup | |
| 5,389,158 A | 2/1995 | Frass et al. | |
| 5,407,491 A | 4/1995 | Freundlich et al. | |
| 5,496,415 A | 3/1996 | Barnham | |
| 5,626,687 A | 5/1997 | Campbell | |
| 5,851,310 A | 12/1998 | Freundlich et al. | |
| 5,853,497 A | 12/1998 | Lillington et al. | |
| 6,147,296 A | * 11/2000 | Freundlich | 136/255 |

OTHER PUBLICATIONS

Zorpette, Gelenn, "Photovoltaics: technical gains and an uncertain market," pp. 40–41, IEEE Spectrum, Jul. 1989.

Yates, Marshall, "House Approves Energy Spending Bill,": Public Utilities Fortnightly, pp. 40–41, Jul. 1990.

"USAF Funding R&D to Design More Efficient Solar Cells," Aviation Week & Space Technology, pp. 81, 85, Apr. 1989.

Nordwall, Bruce D., "Satellite to Probe Solar Cell Damage From Space Plasma and Radiation," Aviation Week & Space Technology, Feb. 17, 1992.

Greenberger, Leonard S., "SCE Reveals Promising Solar Technology, Public Utilities Fortnightly".

Shen, C.C., et al., "An In0.53Ga0.47As Tunnel Diode for Monolithic Multijunction Solar Cell Application," pp. 771–776, IEEE (1988).

(List continued on next page.)

*Primary Examiner*—Mark Chapman
(74) *Attorney, Agent, or Firm*—Baker Botts L.L.P.

(57) ABSTRACT

A two-terminal tandem solar cell is provided. The inclusion of thin (few nm-thick) narrow band-gap InGaAs quantum wells in the intrinsic (i) region of the conventional p-i-n GaAs solar cell extends the photo-absorption of the conventional GaInP/GaAs tandem cell toward the infrared. Beginning-of-Life efficiencies in excess of 30% are predicted. Modeling data indicate end-of-life efficiency of these cells will exceed 25% AM0.

7 Claims, 8 Drawing Sheets

OTHER PUBLICATIONS

Tyner, John T., "Desert Totoises Drive 220–kV Line Construction Skyward," pp. 28–30, Transmission & Distribution, Sep. 1991.

Annan, Robert H., "Photovoltaic solar approaches role as peaking power producer," Power Engineering, Apr. 1989.

Rose, Jerome, "Solar Furnaces: Concentrating 100,000 Suns," pp. 42–46, Mechanical Engineering, Feb. 1991.

Ashley, Steven, "Solar Photovoltaics: Out of the Lab and onto the Production Line," Mechanical Engineering, Jan. 1992.

Miller, William H., "Back Into the Sunshine," Industry Week, pp. 52–56, Feb. 1991.

Ahrenkiel et al., "Design of High Efficiency Solar Cells by Photoluminescence Studies," 21st IEEE Photovoltaic Specialists Conf., p. 432–436, May 1990.

* cited by examiner

MULTI-QUANTUM WELL TANDEM SOLAR CELL

This application is a continuation of Ser. No. 09/347,207 filing date Jul. 2, 1999 U.S. Pat. No. 6,147,296, which is a continuation-in-part of Ser. No. 09/105,643 filing date Jun. 26, 1998 U.S. Pat. No. 6,150,604, which is a continuation-in-part Ser. No. 08/568,129 filing date Dec. 6, 1995 of U.S. Pat. No. 5,851,310.

FIELD OF THE INVENTION

This invention pertains to solar cells. More particularly, a conventional gallium indium phosphide/gallium arsenide tandem photovoltaic cell is modified by inserting quantum wells, while avoiding lattice defects, to increase conversion efficiency.

BACKGROUND OF THE INVENTION

Solar cells convert photons into electrical energy using semiconductors. In semiconductors, a valence band and a conduction band of electrons are separated by an energy gap that depends on composition. When a photon is absorbed, an electron is increased in energy and moves from the valence band into the conduction band. The hole that is created in the valence band then acts as a positive charge carrier. A p-n junction in the material permits current flow in one direction but restrains it in the opposite direction, making possible conversion of photon absorption into electrical current.

The market for solar cells for use in space, particularly for satellites and vehicles operating in low- or medium-earth orbit, has increased greatly in recent years. Just the global telecommunication satellite niche represents a market size of $600M–$1 Billion over the next 5 years (Meyer, M. and Metzger, R. E.,"Compound Semiconductors," 1997) (300 satellites with a power average requirement of 1 KW/satellite with the price of solar panels approaching $2000–3000 per watt). Currently, tandem cells have 30% of that market. A tandem solar cell includes at least two cells—a cell that receives light first and absorbs higher energy photons and another cell that receives light transmitted through the first cell and absorbs lower energy or longer wavelength radiation. The cells may be connected by a tunnel junction or by a mechanical form of electrical interconnect. Tandem solar cells overcome a fundamental limitation of single cells, which are limited to absorption of a narrower band of wavelengths. The fundamental efficiency limitation in a single solar cell results from the trade off between a low bandgap, which maximizes light absorption and hence the output current, and a high band gap, which maximizes output voltage. In tandem cells having two or more series-connected cells with different bandgaps the top cell converts the high energy photons (UV and visible photons) and the bottom cell made of a material with smaller bandgap converts transparency losses of the top cell.

In recent years GaInP/GaAs tandem solar cells with AM0 (sunlight incidence in space=1.35 kW/m$^2$) efficiencies in excess of 25% AMO have been reported (Bertness et al, Proc. 24th IEEE PVSC, 1994, pp.1671–1678). Driven by a demand for satellites with more on-board power the technology has rapidly become one of the industry standards, produced by major photovoltaic (PV) manufacturers. By the end of 1998 these cells were expected to represent almost one third of III-V-semiconductor space solar cell market, according to Meyer and Metzger ("Compound Semiconductors," special issue on current status of the semiconductor industry, 1997, pp. 40–41).

Efficiencies above 30% will be available by substituting the GaAs cell (band gap of 1.42 eV) with a cell that efficiently absorbs lower energy photons and is crystalographically lattice-matched to commonly used Ge or GaAs substrates. But, most common semiconductors having bandgaps in the range of interest, such as ternary $In_xGa_{1-x}As$ alloys, are lattice-mismatched to GaAs. (Lattice mismatch for a 1.2 eV $In_{0.2}Ga_{0.8}As$ is about 1.4%). In order to avoid defect generation and minority carrier performance degradation, only very thin layers (a few hundred Angstroms thick) of these materials can be grown on GaAs. The thin layers are not thick enough for the fabrication of efficient conventional cells. As a result the efficiency and radiation hardness of the existing tandem devices are mainly limited by the photocurrent output and the radiation induced degradation of the GaAs bottom cell. Highest efficiencies are achieved by reducing the thickness (and performance) of the top GaInP cell to below 1 micron, to favor higher photon flux in the bottom GaAs.

What is needed is a bottom cell of a tandem solar cell that is capable of producing increased electrical current from the bottom or GaAs cell by absorbing photons having insufficient energy to be absorbed in the top or GaInP cell. The bottom cell should have characteristics such that reducing the thickness of the GaInP cell is not required and it should be lattice-matched to a GaAs or Ge substrate so as to avoid crystalline defects in the cell.

SUMMARY OF THE INVENTION

The sensitivity of the bottom cell of tandem solar cells to the infrared portion of sunlight is increased by introducing thin (few nm) pseudomorphically strained InGaAs quantum wells into the intrinsic (i) region of a conventional GaAs p-i-n solar cell. The thickness of the individual quantum wells is chosen to be below the onset of lattice relaxation. Incorporation of the narrower band gap quantum wells results in a substantial increase of the cell photocurrent. The optical and electrical characteristics of two junction GaInP/MQW GaInAs tandem cell devices are verified by mathematical models.

DESCRIPTION OF PREFERRED EMBODIMENTS

Figure 1:
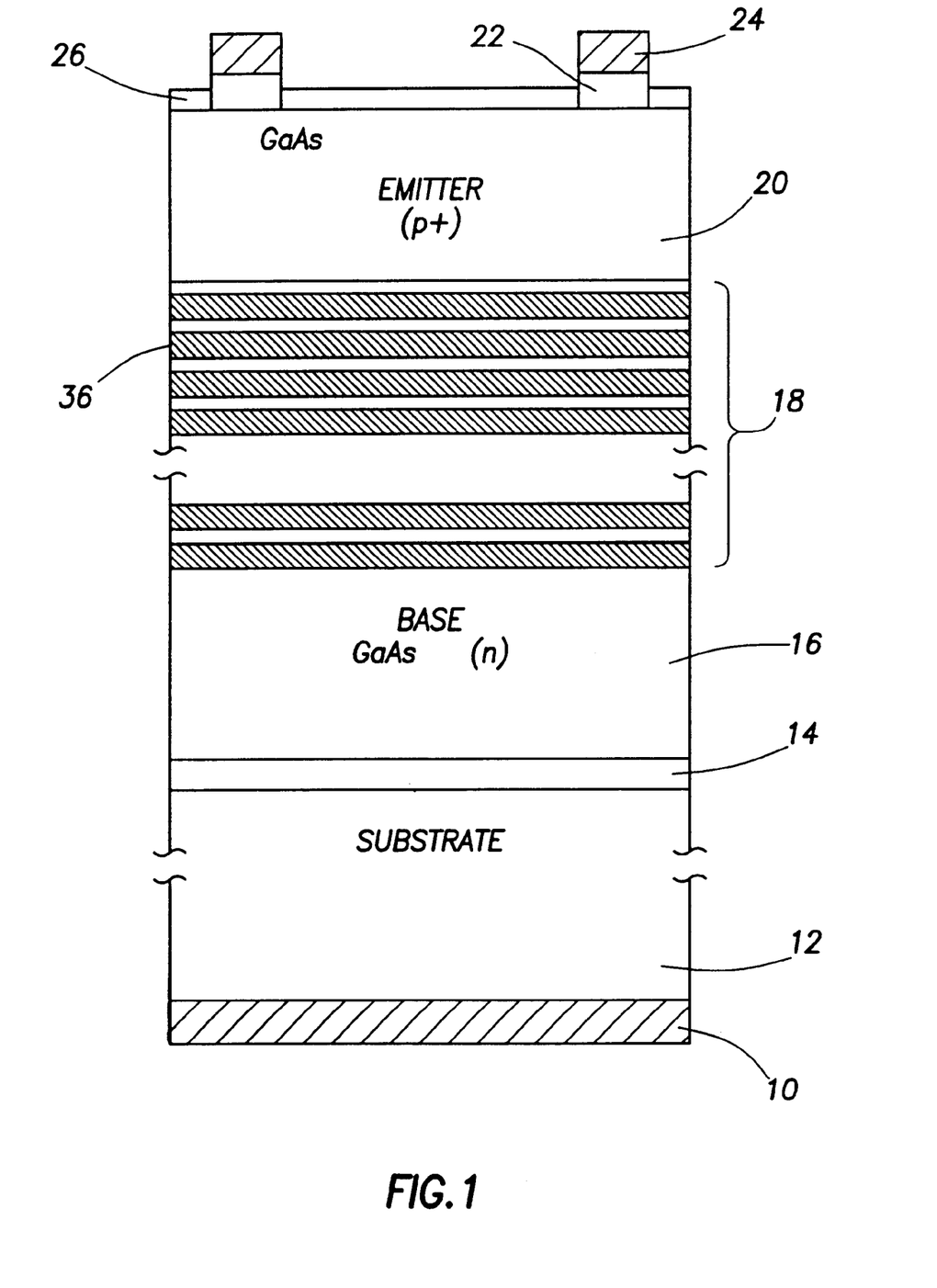
FIG. 1 is a sketch of a multi-quantum well (MQW) photovoltaic cell.
Figure 2:
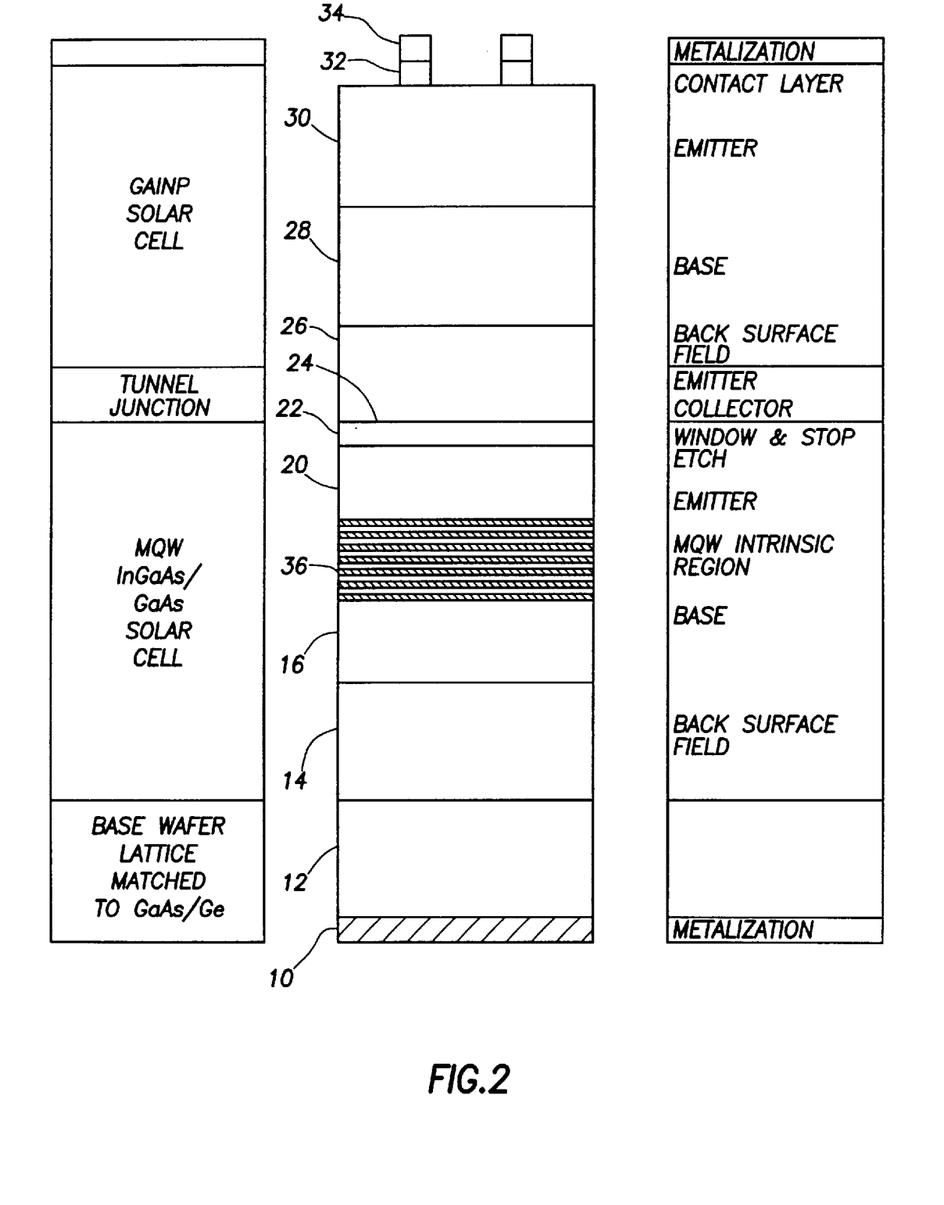
FIG. 2 is a sketch of a tandem solar cell.

Referring to FIG. 1, strained, thin $In_xGa_{1-x}As$ layers (quantum wells) are shown in the intrinsic region of a GaAs p-i-n cell. This materials system is shown as an example of the devices of this invention. The apparatus and method of this invention can be used with a wide variety of materials systems that have the required properties set out below. The cell is fabricated on substrate 12, the top layer of which may be lattice-matched to GaAs and the bottom layer of which is back contact 10, which is preferably a reflective or mirror surface. Alternatively, an in-situ mirror may be placed between the active layers and the cell substrate, as disclosed in U.S. Pat. No. 5,626,687 to Campbell. Back surface field 14, base 16, intrinsic region 18 and emitter 20, which is preferably GaInP, are shown. Other alloys may be used if lattice-matched to substrate 12. In the photovoltaic (PV) cell of this invention, intrinsic region 18 includes one or more quantum wells 36, referred to herein as multi-quantum wells (MQWs). Contact layer 22, front contact 24 and window or antireflective coating 26 complete the PV cell. Use of this cell in a tandem solar cell for use in electrical power generation will normally include use of a wider bandgap cell such as a GaInP cell for absorption of higher energy photons before light enters the cell of FIG. 1. FIG. 2 shows use of the cell of FIG. 1 in a tandem solar cell, in this case beneath a GaInP solar cell shown at 28 and 30 and a tunnel junction connecting the two cells. Contact layer 32 and metallization 34 complete the tandem cell.

Design of the GaAs cell with multi-quantum wells may be made by methods described in copending application Ser. No. 09/105,643, U.S. Pat. No. 6,150,604 which is incorporated by reference herein for all purposes, and U.S. Pat. No. 5,851,310, which is incorporated by reference herein for all purposes. Calculation of the MQW structure absorption coefficient is based on determining the confinement energies of the electrons and holes in quantum wells and on estimating the absorption rate. The confined energies of the electrons and holes are computed within a one-band model. Following the calculation of confined energy levels, the absorption coefficient is calculated from Fermi's golden rule. The first three confined energy states and excitonic effects for the ground state are accounted for. The calculation of the external quantum efficiencies and electrical characteristics of the device were undertaken using previously developed modeling tools. Table 1 provides device parameters used in the MQW cell modeling.

TABLE I

The MQW cell design and modeling parameters.

| PARAMETER | VALUE |
| --- | --- |
| Thickness, emitter (microns) | 0.4 |
| Thickness, base (microns) | 1.2 |
| Doping, emitter ($cm^{-3}$) | $2 \cdot 10^{18}$ |
| Doping, base ($cm^{-3}$) | $5 \times 10^{17}$ |
| well + barrier thickness (microns) | 0.04 |
| Generation-recombination time, (s) | $10^{-6}$ |
| SRV ($cm^{-2} s^{-1}$) | $10^4$ |
| $In_xGa_{1-x}As$ well In composition | x = 0.1–0.2 |
| Illumination | 1 sun AM0 |
| Temperature (K) | 300 |

Figure 3:
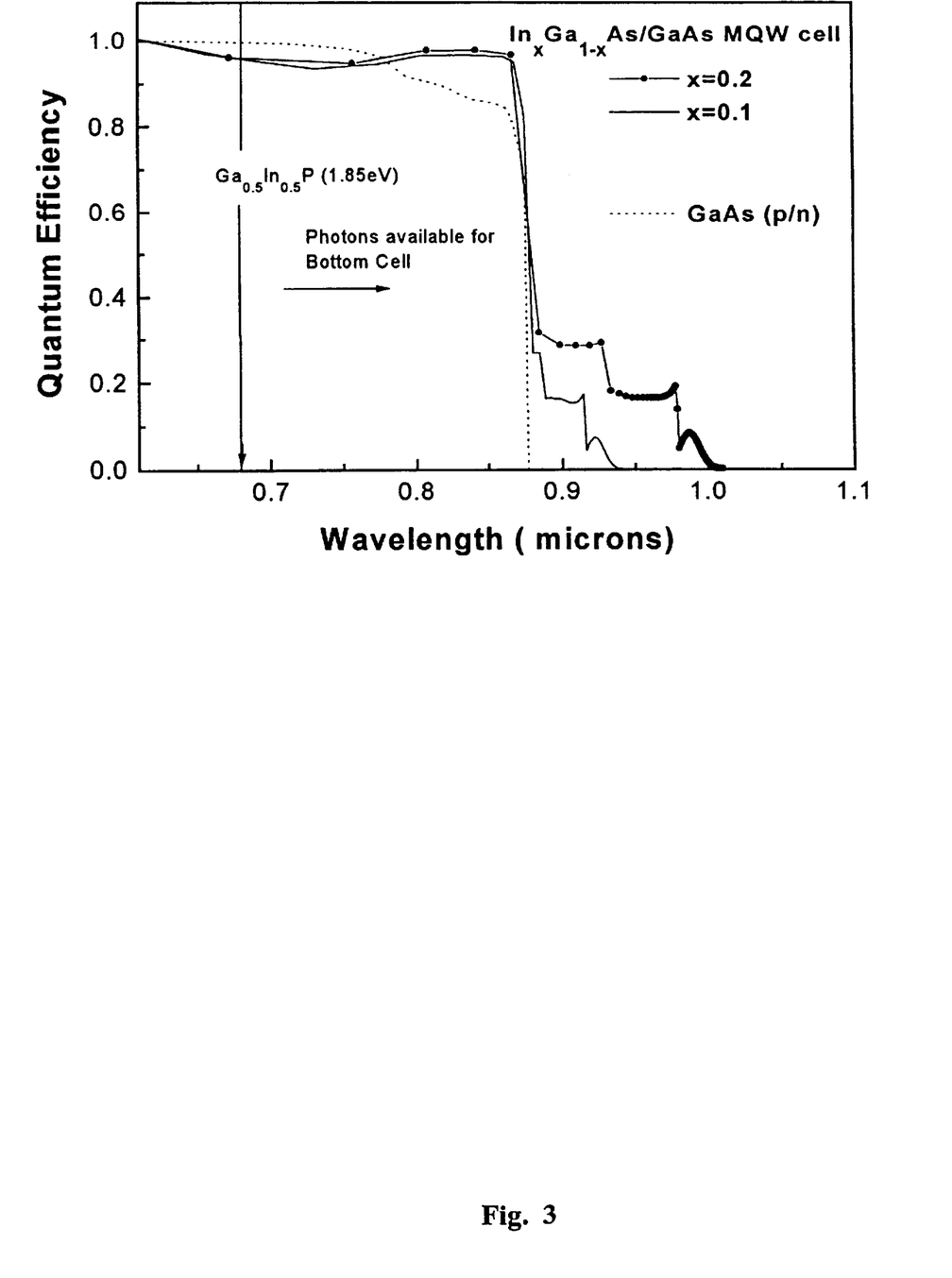
FIG. 3 is a graph of the spectral response of GaAs and 10-period MQW GaAs cells.
Figure 4:
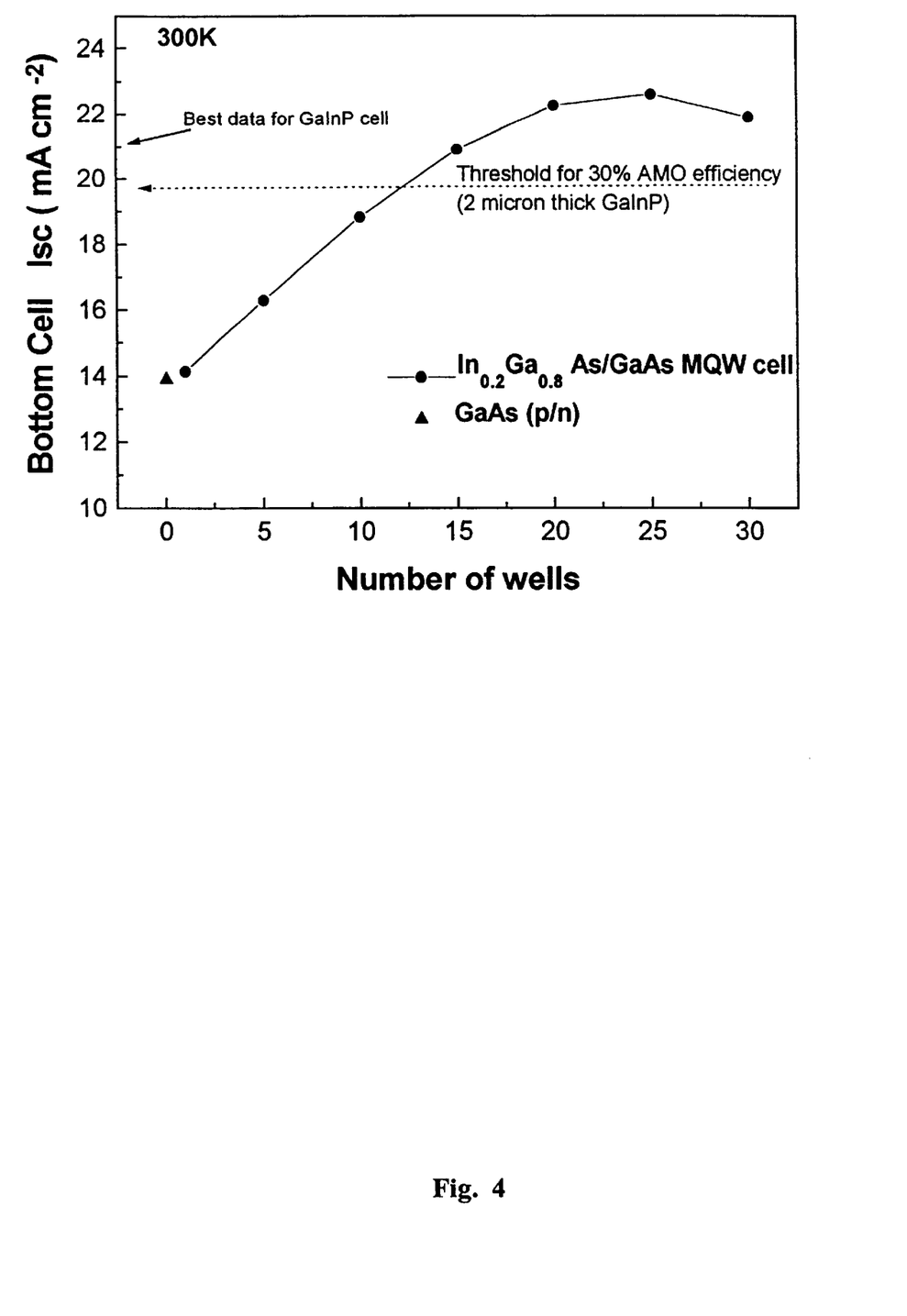
FIG. 4 is a graph of short-circuit electric current output vs. the number of quantum well periods for GaAs and a GaAs (InGaAs) MQW cell for the solar spectrum with photons below 1.85 eV.
Figure 5:
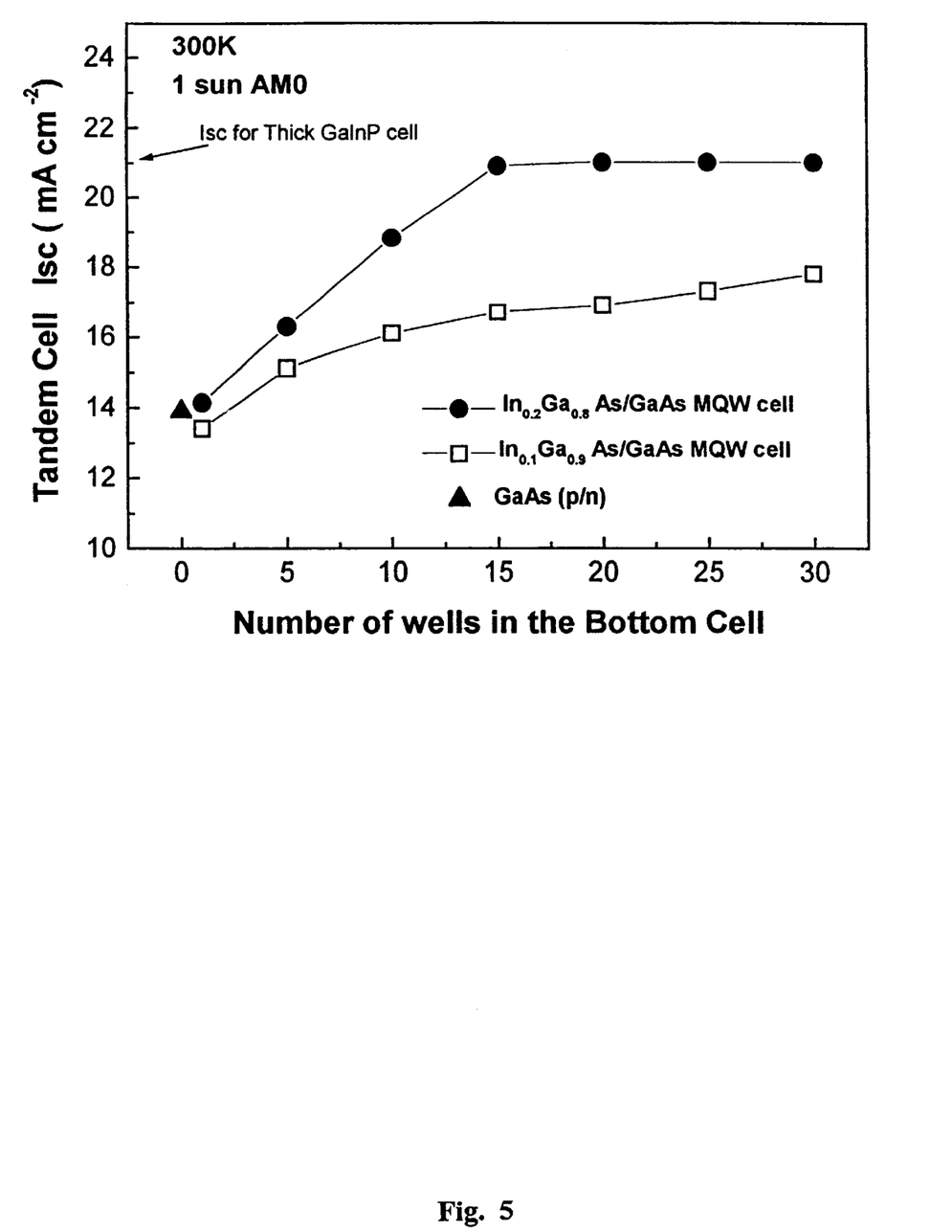
FIG. 5 is a graph of short-circuit electric current as a function in number of wells in the bottom cell MQW for well widths of 8 nm.

The external quantum efficiency of such MQW device will present an increased sensitivity to infrared radiation (FIG. 3). Calculations indicate that the current output resulting from the conversion of available photons having energies below the $In_{0.5}Ga_{0.5}P$ band-gap photons can be substantially increased by increasing the number of wells in the intrinsic region (FIG. 4). A tandem solar cell including the GaAs cell with MQWs provides a near-ideal spectral matching between top and bottom cells, while maintaining the entire structure lattice-matched to commonly used GaAs or Ge substrates. The current output of the MQW—bottom cell can be maximized or made superior to that of a conventional thick GaInP top cell. Results of calculations shown in FIG. 5 are for short circuit current (Isc) as a function of increasing number of wells in the bottom cell, when the quantum wells are constructed with two different compositions: the solid circles are for the composition $In_{0.2}Ga_{0.8}As$ and the open squares are for the composition $In_{0.1}Ga_{0.9}As$. The thickness of the wells in both cases is 8 nm. The cell is operating in conjunction with a semi-infinite top cell (only below GaInP band gap photons are taken into account) and a 0.1 micron GaAs tunnel diode or tunnel junction. The current for a conventional GaAs p/n cell is shown in a solid triangle. As shown in the graph, the current output of the MQW bottom cell can be made larger than the current of a conventional thick GaInP top cell. Currents are for a temperature of 300 K and 1 sun AM0. As shown on the graph, calculations indicate that the current output of a thick GaInP cell can exceed 20.5 $Acm^{-2}$. The current output of the MQW cell is expected to exceed that of a thick GaInP cell. Hence the tandem cell $I_{sc}$ can be substantially enhanced.

Figure 6:
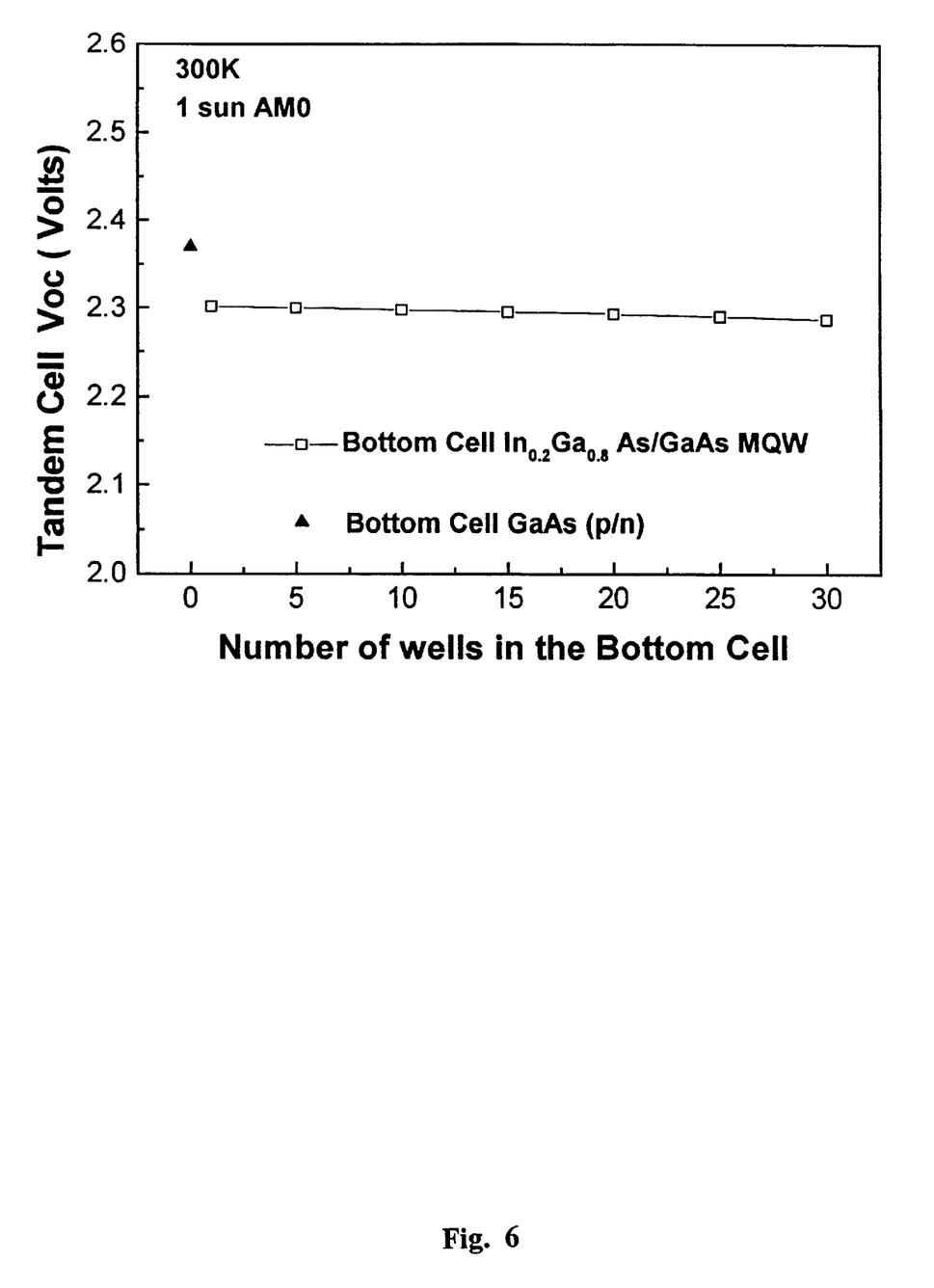
FIG. 6 is a graph of open circuit voltage vs. number of wells in the bottom cell for a MQW cell.

The presence of quantum wells in the bottom cell results in a reduction of the bottom cell open-circuit voltage. The effect of the number of wells on the tandem cell open circuit voltage for a MQW tandem cell is shown in FIG. 6 and the voltage is compared with that of a conventional GaInP/GaAs tandem cell. Again, the wells are assumed to be 8 nm wide and data are for a temperature of 300 K at 1 sun AM0.

Figure 7:
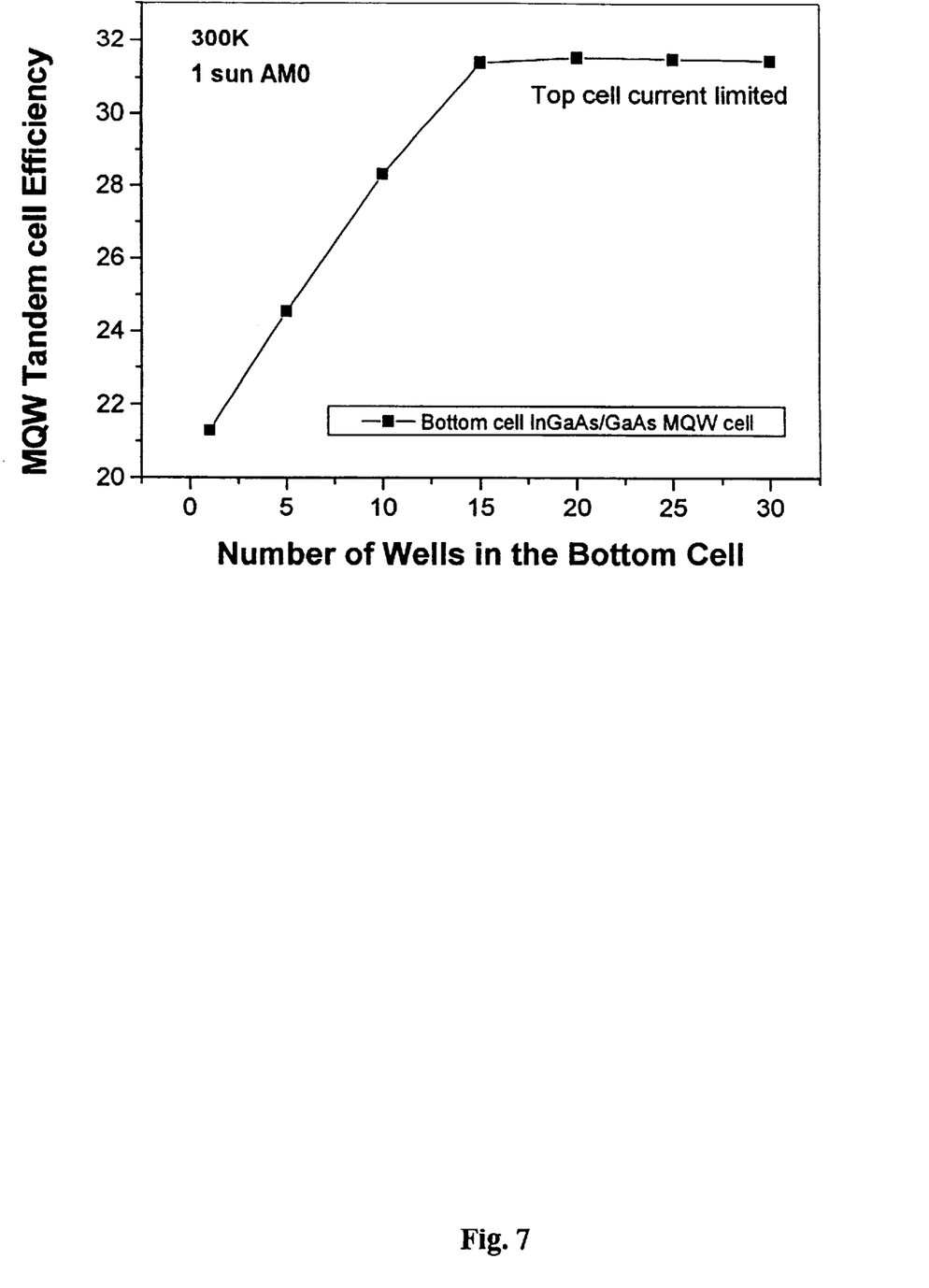
FIG. 7 is a graph of beginning-of-life efficiency of a tandem solar cell as a function of the number of wells in a MQW bottom cell.

Despite the higher dark current in the MQW cell, the model does not indicate any notable cell fill factors (FF) degradation, leading to a two-terminal GaInP (top cell)/ GaAs/GaInAs multiquantum well (bottom cell) tandem solar cell with efficiencies in excess of 30% AM0 at beginning of life (BOL), as shown in FIG. 7. Complete data are shown in Table II. Again, well width was assumed to be 8 nm.

TABLE II

Projected Beginning of Life (BOL) characteristics for the proposed dual junction GaAs ($In_{0.2}Ga_{0.8}As$)/GaInP quantum well cell.

| | Voc | Isc | FF | η AM0 |
| --- | --- | --- | --- | --- |
| InGaP Cell | 1.35 | 21 | 89 | 18.9 |
| MQW cell | 0.95 | 23 | 85 | 13.7 |
| Tandem | 2.3 | 21 | 89 | 31.5% |

The available excess current in the bottom cell provides a unique advantage where radiation-induced degradation of a tandem cell is no longer controlled by degradation of GaAs but follows essentially that of the extremely radiation-tolerant InGaP cell. Radiation-induced degradation of the MQW cell computed assuming a reduction of minority carrier lifetimes in the conventional p/n part of the cell is shown in Table III. For a typical LEO long duration mission ($1 \times 10^{15}$ $cm^{-2}$ 1 MeV electron equivalent), this new tandem cell End of Life efficiency is projected to exceed 26% AM0.

TABLE III

Projected End Of Life (EOL) characteristics are for $1 \times 10^{15}$ cm$^{-2}$, 1 MeV electron radiation.

|  | Voc | Isc | FF | η EOL |
|---|---|---|---|---|
| Thick InGaP | 1.30 | >19 | 89 | 17.8 |
| MQW cell | 0.85 | 21 | 85 | >11 |
| Tandem | 2.15 | 19 | 89 | 26.9% |

Figure 8:
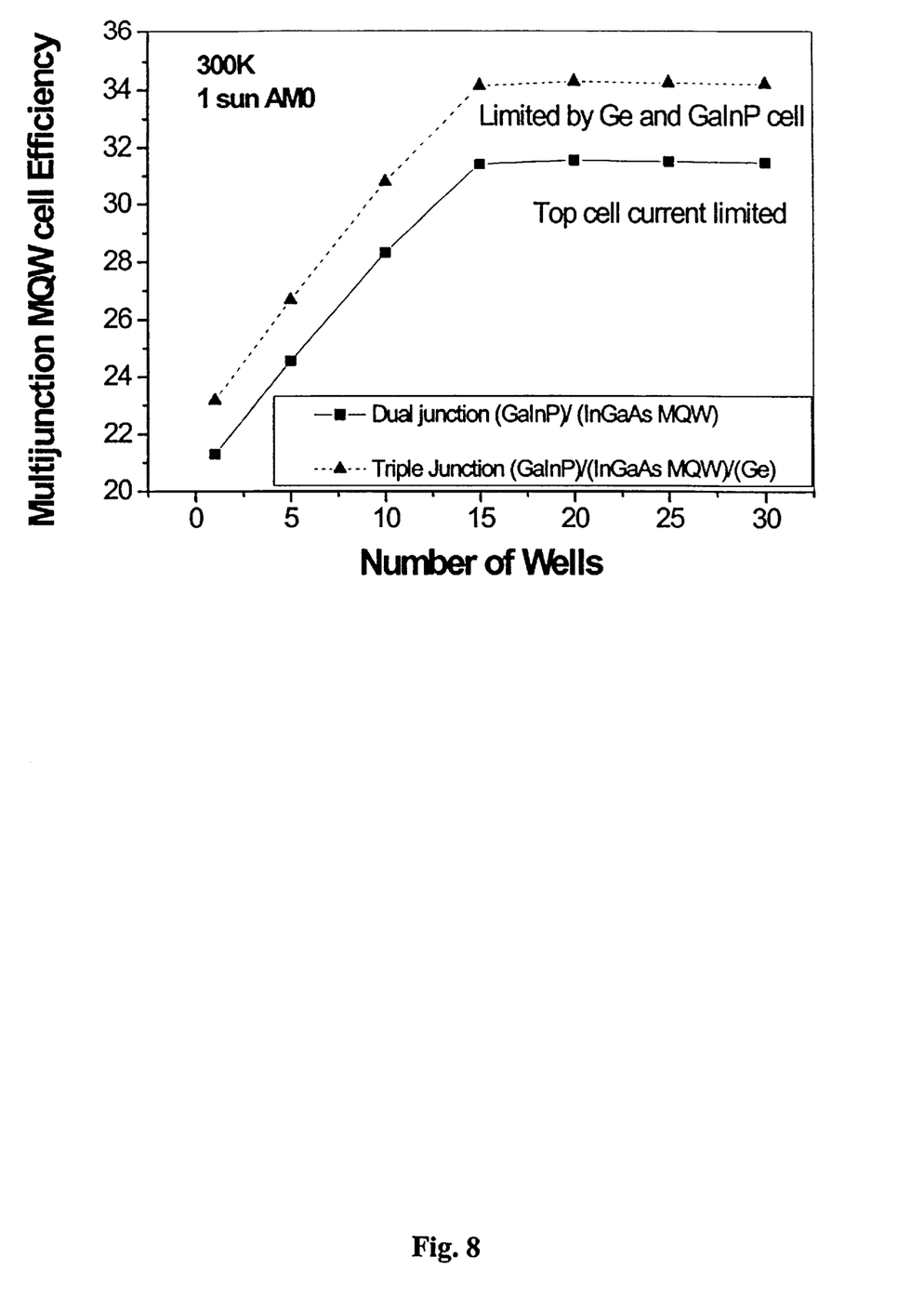
FIG. 8 is a graph of efficiency of a dual junction cell and a triple junction cell.

Figures supplied above related to tandem solar cells having two sub-cells, but the advantages of the multi-quantum wells to increase efficiency can be realized with additional sub-cells. FIG. 8 shows the increased efficiency obtained with various numbers of wells in both dual junction cells and triple junction wells. The triple junction cells includes a germanium cell beneath the MQW cell, which is also increased in efficiency as a result of the MQW cell. Thus, improved results extend to solar cells having two or more sub-cells.

Ranges of parameters of the MQW cell in GaAs are set out in Table IV.

TABLE IV

The PV cell embodiment parameters.

| PARAMETER | possible | Preferred | Most preferred |
|---|---|---|---|
| Thickness, emitter (microns) | 0.02–1 | 0.05–0.5 | 0.2 |
| Thickness, base (microns) | 0.2–6 | 1–3 | 2.5 |
| Doping, emitter (cm$^{-3}$) | $10^{17} \cdot 10^{19}$ | $1$–$5 \times 10^{18}$ | $2 \cdot 10^{18}$ |
| Doping, base (cm$^{-3}$) | $1$–$100 \times 10^{16}$ | $1$–$50 \times 10^{16}$ | $10^{17}$ |
| Period, well + barrier, thickness (microns) |  |  | 0.028 |
| Well Thickness | 1–20 nm | 1–9 nm | 1–5 nm |
| Barrier Thickness | 5–100 nm | 10–50 nm | 15–30 nm |
| Number of wells | 1–50 | 1–30 | 1–15 |
| In$_x$Ga$_{1-x}$As well In composition | 0.05–0.45 | 0.1–0.35 | 0.1–0.25 |

The well thickness and composition are adjusted to provide maximum current without relaxation of the structure.

Epitaxial growth runs of PV cells are accomplished by Chemical Beam Epitaxy (CBE) using trimethylindium (TMIn) and pre-cracked arsine (AsH3) and phosphine (PH3) as growth precursors. Si and Be solid sources are preferably used as n-type and p-type dopants respectively. Any III-V epitaxial technique that allows growth of p- and n-type materials and quantum wells (such as MOCVD, VPE, MBE or any combination of these techniques) will be adequate to fabricate these devices. Such processes are described in U.S. Pat. No. 5,407,491, which is incorporated herein by reference. One of the advantages of Chemical Beam Epitaxy over MOCVD (MOVPE) is the lower growth temperatures allowing sharper interfaces and reducing dopant cross diffusion. This issue is crucial to avoid the degradation of the MQW region during the subsequent growth of the GaAs emitter and the contact layer. Structures are grown in the 480–580° C. temperature range on highly Si-doped substrates at a typical growth rate of 1–2 μm/h (about 1–2 monolayer/sec.). The undoped QWs are incorporated in the intrinsic region of p-i-n structures with each well separated by barrier thick enough to prevent the effect of wave function coupling on carrier transport. The well and barrier thickness and number of periods are chosen so that critical thickness is not exceeded. "Critical thickness" is the thickness at which crystalline defects increase. Method of predicting critical thickness are disclosed in copending patent application 09/105,643, which is incorporated by reference herein. Interruption growth intervals are monitored and improved in terms of species transient by using mass spectrometry and in situ real time reflection high-energy electron diffraction (RHEED) observations. Between the growth of successive layers, the TMIn and TMG flow are interrupted. To prevent surface decomposition, the AsH3 flow may be maintained at a constant rate throughout the growth. Under optimum growth conditions, a two dimensional 2×4 RHEED pattern is maintained throughout the growth the MQW region. The QW region is preferably grown at a growth rate of 0.3–3 micron per hour and most preferably at a rate of 0.7–1 microns/hour. Following the growth process non-alloyed Au/Ge and Au metallic layers, deposited by vacuum evaporation, are used as n-type (on substrate) and p-type ohmic contacts respectively. The Au-top contact grid is obtained using a lift off technique. A mesa etching of the structure may provide a total area per cell of 5×5 mm2. The grid shadowing is estimated to be about 10%. A conventional single or bilayer ARC can be implemented to reduce reflection losses at the device top surface.

The proposed approach can be extended to the following systems in conjunction with the use any type of narrow bandgap conventional p-n cell: AlGaInP, AlGaAs, InP, InGaAs, InGaAsP or InGaAsN. The well material can be substituted by InGaAsN, GaSb, GaInAs, InAsPN InGaAsSb or any combination of these materials that will allow the growth of a MQW region that is pseudomorphically strained to the conventional device base region.

The invention has been described with respect to its preferred embodiments. Those of ordinary skill in the art may, on reading this disclosure, appreciate changes or modification that do not depart from the spirit of the invention as described above or claimed hereafter.

What I claim is:

1. A semiconductor photovoltaic energy conversion device, comprising:
   a plurality of conversion cells, the conversion cells being electrically connected in a tandem configuration, at least one of the cells having a region containing a plurality of quantum wells.

2. The device of claim 1 wherein the cell having a region containing a plurality of quantum wells is comprised of a semiconductor selected from the group of semiconductors consisting of gallium arsenide, gallium phosphide, aluminum gallium indium phosphide, aluminum gallium arsenide, indium phosphide, indium gallium arsenide, indium gallium arsenide phosphide and indium gallium arsenide nitride or mixtures of these semiconductors.

3. The device of claim 1 wherein the quantum wells in the cell having a region containing a plurality of quantum wells are comprised of a semiconductor selected from the group of semiconductors consisting of gallium arsenide, aluminum gallium arsenide, gallium antimonide, indium antimonide, indium gallium arsenide, indium gallium phosphide, indium arsenide, gallium arsenide nitride, indium gallium arsenide nitride, indium arsenide phosphide nitride, indium gallium arsenide antimonide, gallium arsenide phosphide or mixtures of these semiconductors.

4. A semiconductor photovoltaic energy conversion device having a plurality of conversion cells, the cells being electrically connected in a tandem configuration, at least one of the cells being of the p-i-n or n-i-p junction type, comprising;
   an upper cell, the upper cell comprising an emitter region;

an intermediate cell, the intermediate cell having a base, an intrinsic region, the intrinsic region having a plurality of quantum wells therein, the quantum wells having a thickness selected to avoid lattice relaxation, and an emitter region;

a lower cell comprised of germanium; and electrical contacts to the upper cell and the lower cell.

5. The device of claim 4 wherein the emitter region and the base of the intermediate cell are comprised primarily of gallium arsenide and the wells are comprised primarily of indium gallium arsenide.

6. The device of claim 4 wherein the top cell is comprised primarily of indium gallium phosphide.

7. A photovoltaic device for converting photons into electrical energy, comprising:

at least two cells, the cells being connected in a tandem configuration;

a substrate having an upper surface, the upper surface being lattice-matched to at least one of the cells, at least one of the cells including a region between layers of p-type and n-type semiconductors, the region having one or more quantum wells, the quantum wells having a smaller energy bandgap than the adjacent p-type and n-type semiconductors.

* * * * *